United States Patent
Meyer et al.

(10) Patent No.: US 7,274,213 B1
(45) Date of Patent: Sep. 25, 2007

(54) METHOD AND APPARATUS FOR AUTOMATIC PROTOCOL GENERATION

(75) Inventors: Jerome M. Meyer, Chanhassen, MN (US); Scott A. Davidson, Savage, MN (US)

(73) Assignee: Xilinx, Inc., San Jose, CA (US)

( * ) Notice: Subject to any disclaimer, the term of this patent is extended or adjusted under 35 U.S.C. 154(b) by 251 days.

(21) Appl. No.: 11/123,498

(22) Filed: May 5, 2005

(51) Int. Cl.
*G06F 7/38* (2006.01)

(52) U.S. Cl. .............................. 326/41; 326/37; 326/38; 326/39; 326/40

(58) Field of Classification Search .................. 326/37, 326/38, 39; 365/185.22
See application file for complete search history.

(56) References Cited

U.S. PATENT DOCUMENTS 5,581,198 A * 12/1996 Trimberger .................. 326/38

* cited by examiner

*Primary Examiner*—Rexford Barnie
*Assistant Examiner*—Thienvu Tran
(74) *Attorney, Agent, or Firm*—LeRoy D. Maunu; Lois D. Cartier

(57) ABSTRACT

A dedicated protocol generation unit provides the ability to detect validity of data received from a configurable logic block, such as a programmable logic device (PLD). Data valid signaling is provided by the configurable logic block, such that invalid data received from the configurable logic block is replaced with programmable insertion data prior to transmission, while valid data is allowed to be transmitted without replacement. Also, data received by Input/Output (I/O) portions of the dedicated protocol generation unit are compared to programmable data patterns. After a positive comparison, matching data is either truncated and not delivered to the configurable logic block, or the matching data is delivered to the configurable logic block with appropriate data valid signaling.

19 Claims, 5 Drawing Sheets

METHOD AND APPARATUS FOR AUTOMATIC PROTOCOL GENERATION

FIELD OF THE INVENTION

The present invention generally relates to Integrated Circuits (ICs), and more particularly to ICs exhibiting dedicated protocol generation blocks.

BACKGROUND

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells that define how the programmable elements are configured. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to Input/Output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored off-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Some PLDs, such as the Xilinx Virtex® FPGA, can be programmed to incorporate blocks with pre-designed functionalities, i.e., "cores". A core can include a predetermined set of configuration bits that program the FPGA to perform one or more functions. Alternatively, a core can include source code or schematics that describe the logic and connectivity of a design. Typical cores can provide, but are not limited to, DSP functions, memories, storage elements, and math functions. Some cores include an optimally floor planned layout targeted to a specific family of FPGAs. Cores can also be parameterizable, i.e., allowing the user to enter parameters to activate or change certain core functionality.

In many communication applications, for example, PLD based systems are used to balance the efficiency of Application Specific Integrated Circuits (ASICs) with the flexibility of software. In such systems, the PLD off-loads the Central Processing Unit (CPU) for specific algorithms that are not efficiently handled within the CPU. While the PLD affords the user with great flexibility of design, it may also present the user with the requirement of managing a large number of design attributes, which may or may not be of interest to the user. Such design attributes may include communication attributes that are associated with the physical, as well as the other hierarchically arranged, communication layers of an Open Systems Interconnection (OSI) based system.

In the prior art, for example, communication protocol blocks are among the many block functionalities that may be incorporated into the soft core of the PLD. Such implementations, however, utilize a substantial portion of the programmable fabric that exists within the PLD. Further, such placement of the communication protocol blocks require the user to track and maintain all of the features and specification attributes that are associated with the communication protocol. In some instances, the user may wish to be free from such a protocol management task.

SUMMARY

To overcome limitations in the prior art, and to overcome other limitations that will become apparent upon reading and understanding the present specification, the present invention includes an apparatus and method for allocating a dedicated data frame insertion/deletion block that is external to the PLD fabric. The data frame insertion/deletion block is fully programmable and is able to conform to virtually any communication protocol that requires particular data characters during any data period.

In accordance with one embodiment of the invention, a field programmable gate array (FPGA) comprises a plurality of configurable logic resources that are coupled to a configuration memory and are adapted to perform a logic function in response to data in the configuration memory. The FPGA further comprises a hardwired logic circuit that is arranged to be coupled to the plurality of configurable logic resources in response to data in the configuration memory. The hardwired logic circuit is adapted to exchange internal data with the configurable logic resources. The hardwired logic circuit includes a first data-valid circuit that is coupled to receive the internal data and is adapted to generate a first signal that indicates whether the internal data is valid and a first register that is coupled to receive the internal data. The hardwired logic circuit further includes a programmable data generator that is adapted to generate programmable data with at least one value responsive to programming of the programmable data generator. The hardwired logic circuit further includes a multiplexer that is coupled to the first data-valid circuit, the first register, and to the programmable data generator, the multiplexer being arranged to select between data from the first register and data from the programmable data generator in response to a state of the first signal.

In accordance with another embodiment of the invention, a programmable logic device (PLD) includes a hardwired logic block that comprises a configuration module that is coupled to provide first and second programmable data words. The hardwired logic block further comprises a first detector that is coupled to receive the first programmable data word and a first data word from a configurable logic portion of the PLD and is adapted to replace the first data word with the first programmable data word in response to detecting that the first data word is invalid. The hardwired logic block further comprises a second detector that is coupled to receive a second data word from external to the PLD and is adapted to compare the second data word to the second programmable data word to detect whether the second data word is invalid.

In accordance with another embodiment of the invention, a method of implementing a communication protocol comprises transmitting first data words from within a configurable logic portion of a programmable logic device (PLD), receiving the first data words at a hardwired logic portion of the PLD, generating first programmable data words having values responsive to programming of the hardwired logic circuit, and replacing the first data words with the first programmable data words by the hardwired logic portion of the PLD in response to receiving an indication from the configurable logic portion of the PLD that the first data words are invalid.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
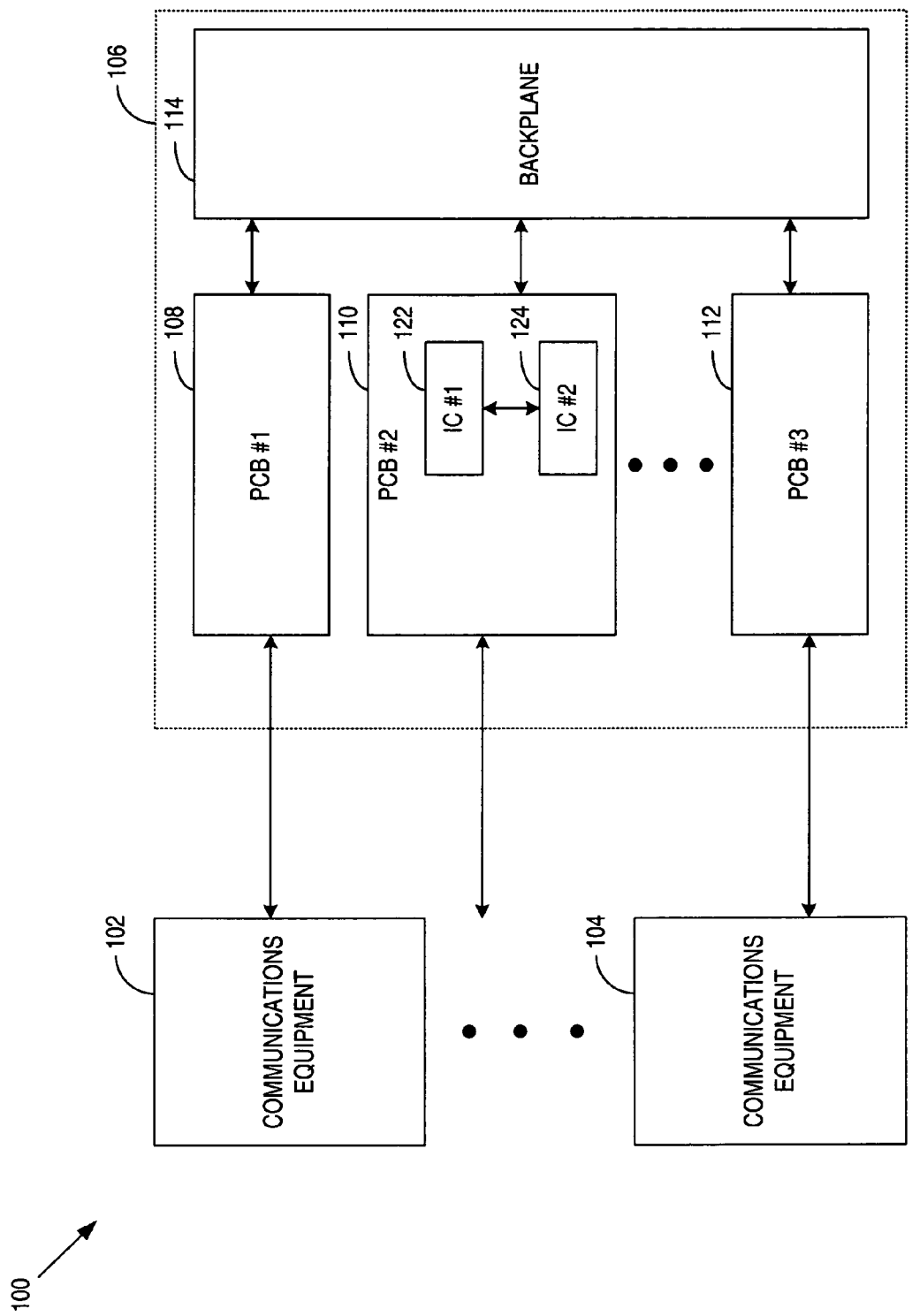
FIG. 1 illustrates an exemplary communication system.

Generally, the present invention is applied to the field of integrated circuits (IC) of which PLDs are a subset. In particular, the embodiments of the present invention contemplate ICs that allocate a hardwired logic circuit for idle frame handling, which is separate from the configurable logic resources of the PLD. The idle frame handling blocks may be applied to different communication protocols employed by the I/O block portions of the PLD. Since the allocation of the idle frame block is implemented using standard cell libraries, the idle frame block exhibits high speed capability with minimized area requirements.

It should be noted that the hardwired logic circuit of the PLD is differentiated from the configurable logic resources of the PLD, since the functions within the hardwired logic circuit are highly specialized, and therefore, limited in scope as compared to the configurable logic resources of the PLD. The configurable logic resources of the PLD, on the other hand, are generalized, programmable logic blocks that may undergo significant functional change simply by downloading a stream of configuration data into the relevant configuration memory cells of the PLD. Such functional changes are much less restricted in the configurable core of the PLD, since the configurable core provides generalized functionality, as compared to the highly specialized functions of the hardwired logic circuit. In addition, the hardwired logic circuit often exhibits an enhanced speed of operation as compared to the configurable core of the PLD.

Idle frame handling block accessibility that is external to the PLD fabric also allows automated capability that is transparent to the PLD fabric. In particular, communications received from the PLD fabric by an I/O block of the PLD may, or may not, contain valid data. Such would be the case, for example, during idle periods where no data is being transmitted by the PLD fabric. Many communication protocols, however, often require that the transmission data exhibit a particular pattern, even during idle periods.

The present invention, therefore, contemplates one embodiment whereby the PLD fabric flags the transmission with a valid data bit. Once the validity of the data from the PLD fabric is determined, the data frame handling block operates in accordance with one embodiment of the present invention to either forward the data received from the PLD fabric (i.e., when the data is valid) on to the I/O transceiver, or to replace the data with alternate data (i.e., when the data is invalid) prior to forwarding.

Detection/deletion of invalid data patterns from external devices to the PLD may also be facilitated by an embodiment of the present invention. In particular, one embodiment is contemplated whereby the data received is compared to a particular data pattern. In the case of a match, the data is deemed to be invalid and is marked as such by the idle frame handling block. Once marked, the data may then be discarded, so that invalid data never reaches the PLD fabric. Alternatively, the data may be marked as invalid and forwarded onto the communication stack operating within the PLD fabric. If, on the other hand, the data is valid, then the communication stack operates on the data as required.

Application of the present invention is virtually unlimited and may be utilized with any communication protocol that requires deletion and/or replacement of invalid data patterns with alternate, programmable data patterns. Communication system 100 of FIG. 1, for example, is illustrated in which the present invention may be utilized. Communications equipment blocks 102-106 may represent communicating entities, in which communication takes place at various levels and distances using various wired and/or wireless technologies.

Communications equipment blocks 102-104, for example, may communicate with communications block 106 via a Local Area Network (LAN) or Storage Network (SN) using technologies such as 1 Gigabit Ethernet, or 10 Gigabit Ethernet, as specified by IEEE 802.3. Communication system 100 may represent a data center, a storage network, or a System Area Network (SAN), for example, in which the Infiniband serial I/O interconnect architecture, or Fiber Channel, is utilized. Conversely, communication system 100 may represent a Synchronous Optical NETwork (SONET) or Synchronous Digital Hierarchy (SDH) employed by many Internet Service Providers (ISPs) and other high bandwidth end users.

Still other communication technologies supported by communication system 100 may include Peripheral Component Interconnect (PCI), PCI-Express, RapidIO, and Serial Advanced Technology Attachment (ATA). Such communication standards may be implemented, for example, to support communications between Printed Circuit Boards (PCBs) 108-112, ICs 122-124, and backplane 114. As can be recognized by one of ordinary skill in the art, any number of communication standards may benefit from the present invention as is discussed in more detail below.

Figure 2:
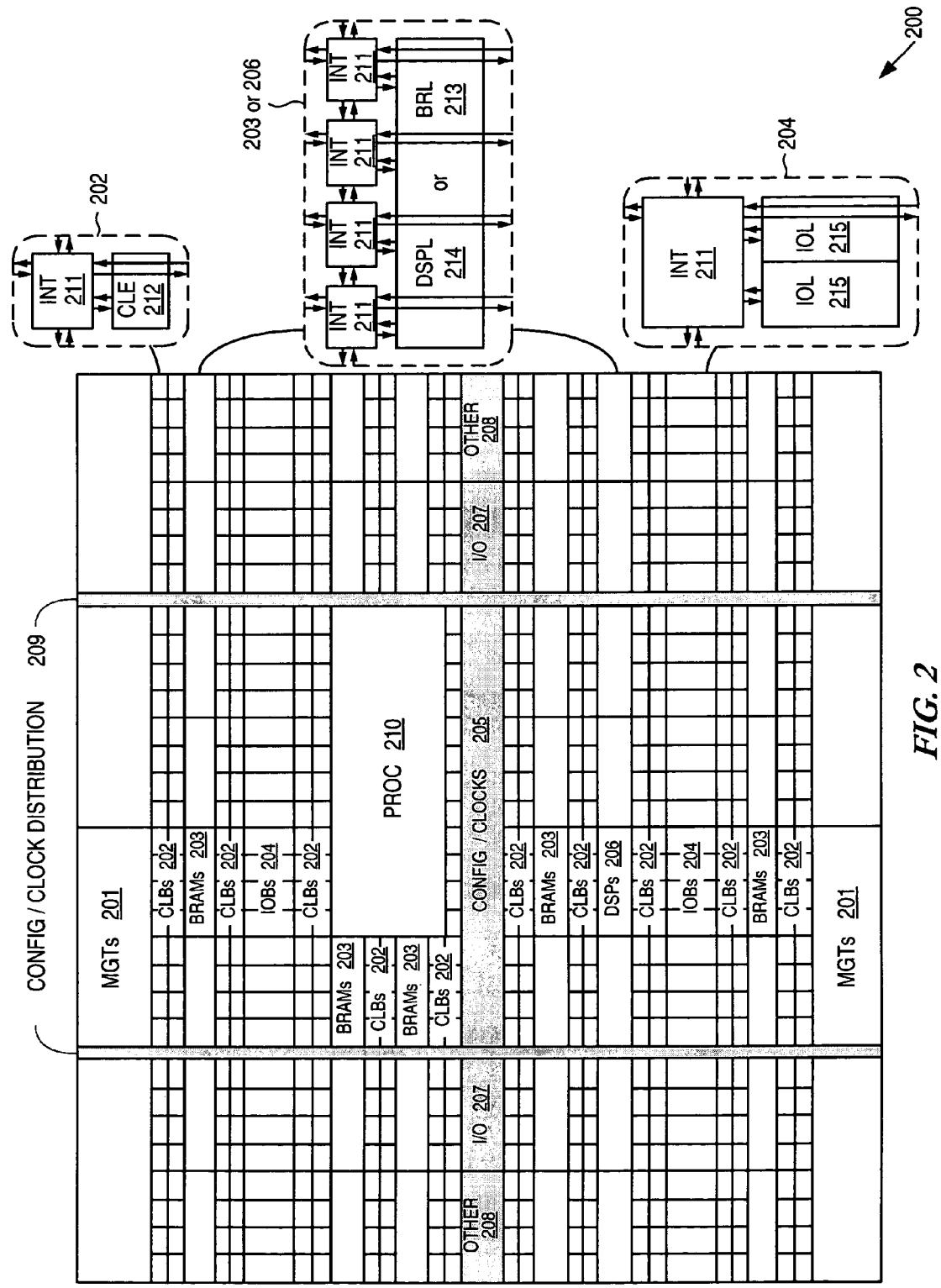
FIG. 2 illustrates an exemplary Field Programmable Gate Array (FPGA) architecture.

As noted above, advanced ICs, such as FPGAs, can include several different types of programmable logic blocks in the array. For example, FIG. 2 illustrates an IC that exemplifies FPGA architecture 200, including a large number of different programmable tiles such as Multi-Gigabit Transceivers (MGTs) 201, CLBs 202, BRAMs 203, IOBs 204, configuration and clocking logic CONFIG/CLOCKS 205, DSPs 206, specialized I/O 207, including configuration ports and clock ports, and other programmable logic 208, such as digital clock managers, analog-to-digital converters, system monitoring logic, and so forth.

Some FPGAs also include dedicated processor blocks PROC 210, in which specific CPU related functionality may be utilized that is separate from the FPGA fabric. In accordance with the present invention, data frame insertion/deletion blocks (not shown) contained within MGTs 201 are also contemplated, which represent separate blocks for invalid data frame handling. Such separate handling of invalid data frame functionality is effective to remove the handling of invalid data frame transmissions from within the FPGA fabric.

Invalid data frame handling, for example, may be required during idle periods of transmission, whereby one embodiment of the present invention provides a customized and hardwired logic circuit for substituting programmable data patterns during the idle periods. Alternatively, the hardwired logic circuit may also scan received data for particular data patterns during the idle periods. The hardwired logic circuit, being separated from the FPGA fabric, is area efficient, fully controllable, accessible from the FPGA fabric, faster than the FPGA fabric, and able to handle different data rates.

In some FPGAs, each programmable tile includes programmable interconnect element INT 211 having standardized connections to and from a corresponding interconnect element in each adjacent tile. Therefore, the programmable interconnect elements taken together implement the programmable interconnect structure for the illustrated FPGA. INT 211 also includes the connections to and from the programmable logic element within the same tile, as shown by the examples of blocks 202 and 204.

For example, a CLB 202 may include a Configurable Logic Element CLE 212 that may be programmed to implement user logic plus a single programmable interconnect element INT 211. A BRAM 203 can include a BRAM logic element (BRL 213) in addition to one or more programmable interconnect elements. Typically, the number of interconnect elements included in a tile depends on the height of the tile (as measured from right to left of FIG. 2). In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 may include, for example, two instances of an input/output logic element IOL 215 in addition to one instance of the programmable interconnect element INT 211.

As will be clear to those of skill in the art, the actual I/O pads connected, for example, to the I/O logic element 215 are manufactured using metal layers above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 may span several columns of CLBs and BRAMs.

Note that FIG. 2 is intended to illustrate only an exemplary FPGA architecture. The number of logic blocks in a column, the relative width of the columns, the number and order of columns, the type of logic blocks included in the columns, the relative size of the logic blocks, and the interconnect/logic implementations 202, 203, and 204 are purely exemplary. For example, in an actual FPGA more than one adjacent column of CLBs is typically included wherever the CLBs appear, to facilitate the efficient implementation of user logic.

Figure 3:
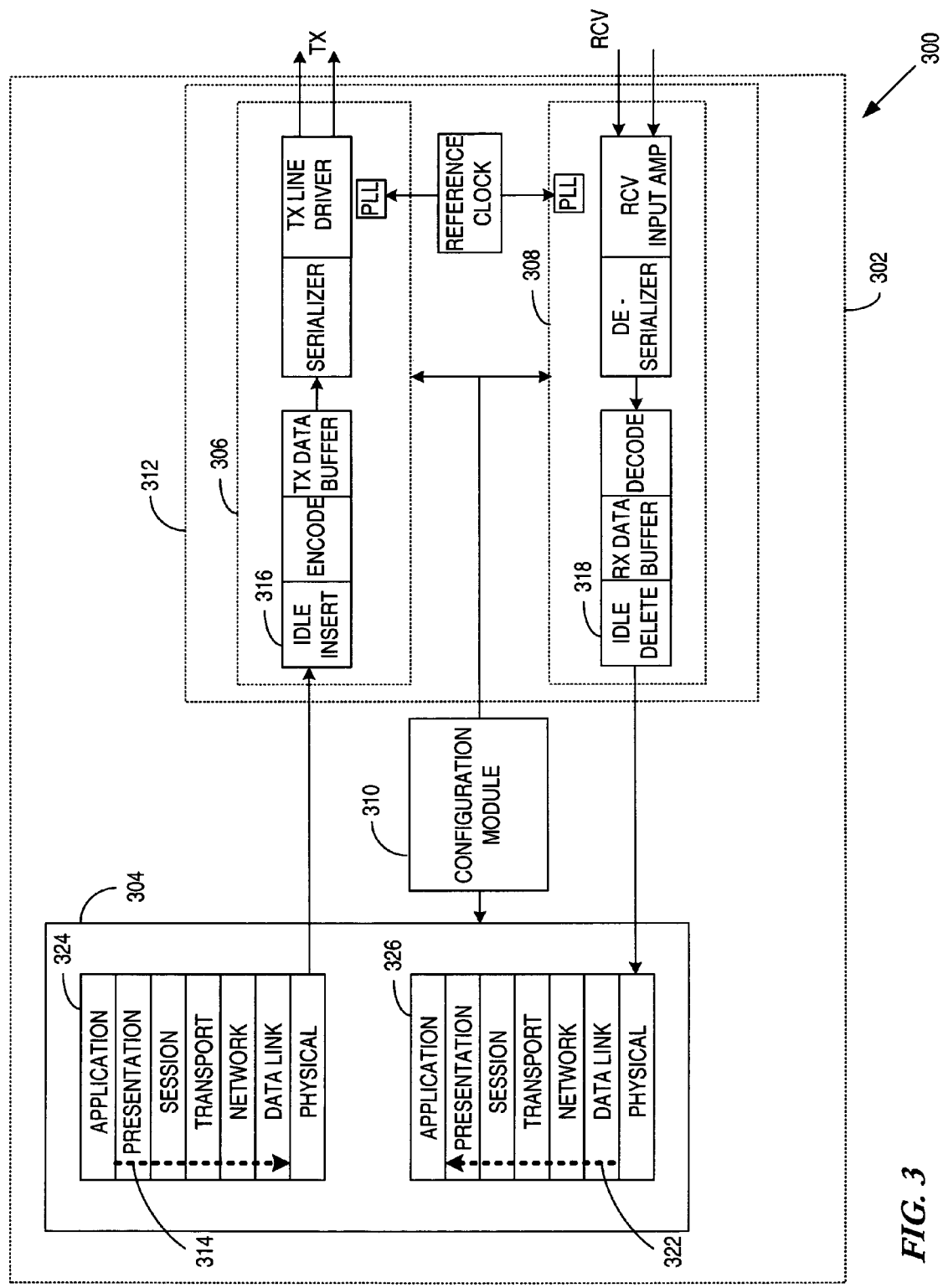
FIG. 3 illustrates an exemplary Field Programmable Gate Array (FPGA) application in accordance with the present invention.

Turning to FIG. 3, exemplary FPGA block diagram 300 in accordance with one embodiment of the present invention is illustrated in which FPGA 302 conducts serial communications with external communications equipment (not shown). Internal to FPGA fabric 304, communication stacks 324 and 326 may be associated with any number of communication protocols and operated in support of those communication protocols. In accordance with an embodiment of the present invention, idle insert block 316 and idle delete block 318 are positioned external to FPGA fabric 304, such that communication links between communication stacks 324 and 326 may be processed transparently with respect to FPGA fabric 304 as illustrated in FIG. 3.

Using such an arrangement, data frames outbound from FPGA fabric 304 may propagate from, for example, the application layer to the physical layer of communication stack 324 via communication path 314. The data frames transmitted to idle insert block 316 are flagged as being either valid, or invalid. If the data frames are marked as valid, idle insert block 316 simply relays the data frames for further processing by transmitter 306. If, on the other hand, the data frames are marked as invalid, idle insert block 316 replaces the invalid data with alternate data. The data frames containing the alternate data are then forwarded to the other processing blocks within transmitter 306.

In such an instance, communication stack 324 of FPGA fabric 304 is relieved of the task of inserting protocol compliant idle characters into the transmitted data stream during idle periods. Instead, communication stack 324 need only signal the presence of the idle period to insert block 316, so that programmable alternate data may instead be selected for transmission.

The programmable alternate data used as the protocol compliant idle characters may be generated in any number of ways. For example, configuration module 310 may extract the alternate data from within the FPGA itself, e.g., from any one of a number of storage locations within FPGA 200 such as BRAM 203 of FIG. 2. Alternatively, configuration module 310 may programmably generate the alternate data that is specific to the particular communication protocol being utilized.

For example, the IEEE 802.3 specification, in some operational modes, requires the transmission of a square wave signal, such as may be the case with the test pattern generation capability as required by the 10GBASE-R specification. In another example, 10 Gigabit Ethernet may require that the idle frames exhibit a square waveform, whereby data bits exhibiting alternating logic levels inserted within the alternate data pattern produce the required square waveform. In other embodiments, duty cycles greater than or less than 50% may also be programmed by grouping the proper number of logic high data bits with logic low data bits as desired.

In another embodiment, the present invention may be used when the communication protocol requires a specific density of data transitions to facilitate, for example, clock recovery from the received data. Character insertion may then be used to guarantee the required data transition density, while reducing, or even eliminating, the communication protocol overhead required of the communication stack executing within the FPGA fabric.

In an alternative embodiment, character insertion may be used to delineate packets of data. In such an instance, invalid data characters may be used as packet boundary delimiters, which may be inserted by one embodiment of the present invention to offload the FPGA fabric. It should be noted, that virtually any data pattern may be substituted/inserted as required by the particular communication protocol of interest.

In an alternative embodiment, data packing may be used to adapt between potential data width differences between the data word widths of FPGA fabric 304 and the data word widths processed by transceiver 312. For example, if the data word width of transceiver 312 is wider than that used by FPGA fabric 312, then idle insert block 316 may augment the data words transmitted by FPGA fabric 312 by packing them with a number of data bits needed to bring the data word widths into conformance with those used by transceiver 312.

The external communications equipment (not shown) completes the communication link with FPGA 302 by transmitting data frames that are received by receiver 308. Idle delete block 318 is then operative to scan the receive data frames for the existence of a predetermined data pattern. If the data pattern is detected to exist within the received data frames, then in one embodiment, the data frames are flagged as being invalid data frames by idle delete block 318 and deleted. Alternatively, the flagged data frames may instead be forwarded on to FPGA fabric 304 for subsequent processing. Otherwise, the data frames are valid and are forwarded onto communication stack 326 of FPGA fabric 304 for subsequent processing by the communication layers 322 of communication stack 326.

The predetermined data patterns that are used by idle delete block 318 for scanning purposes may be generated in any number of ways. For example, configuration module 310 may extract the predetermined data patterns from within the FPGA itself, e.g., from any one of a number of storage locations within FPGA 200 such as BRAM 203 of FIG. 2. Alternatively, configuration module 310 may programmably generate a predetermined data pattern that is specific to the particular communication protocol being utilized, e.g., the square wave idle pattern of 10 Gigabit Ethernet. It should be noted, that idle delete block 318 may scan for virtually any data pattern as may be required by the particular protocol of interest.

It should also be noted, that the alternate data used to replace the invalid data contained within the data frames received from communication stack 324 of FPGA fabric 304 may, or may not be, the same as the data pattern scanned by idle delete block 318. Thus, configuration module 310 may provide two separate data patterns for use by idle insert block 316 and idle delete block 318.

Accordingly, either of idle insert block 316 and idle delete block 318 may proceed with their respective operational activities with complete independence with respect to one another. In one embodiment, while idle insert block 316 engages in the replacement of invalid data received from communication stack 324 of FPGA fabric 304 with alternate data received from configuration module 310, idle delete block 318 may bypass the scan path and simply forward all data received onto communication stack 326 of FPGA fabric 304.

In another embodiment, idle insert block 316 may forward all data received from communication stack 324 of FPGA fabric 304 without replacement, while idle delete block 318 continues to scan for predetermined data patterns and proceeds to mark and/or delete them if found.

In yet another embodiment, while idle insert block 316 engages in the replacement of invalid data received from communication stack 324 of FPGA fabric 304 with alternate data received from configuration module 310, idle delete block 318 continues to scan for predetermined data patterns received from configuration module 310 and proceeds to mark and/or delete them if found. It should be noted that in this instance, the alternate data and the predetermined data patterns received from configuration module 310 may, or may not be, completely independent data patterns.

Figure 4:
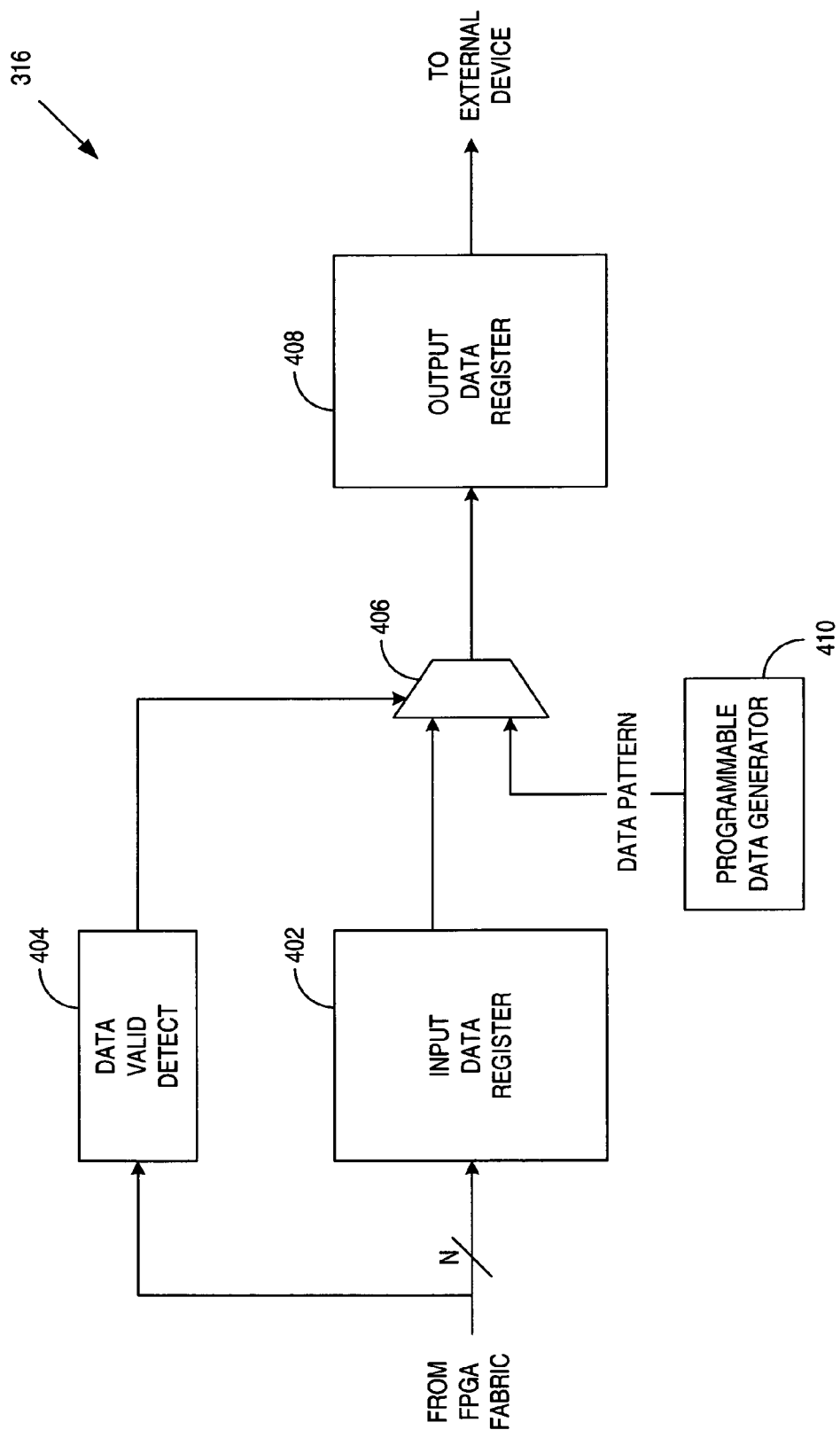
FIG. 4 illustrates an exemplary idle frame insertion block diagram in accordance with the present invention.

Turning to FIG. 4, one embodiment of idle insert block 316 of FIG. 3 is exemplified. Data words of width N are received from FPGA fabric 304 by input data register 402. In addition, signaling is employed by FPGA fabric 304 to indicate whether the data words are valid or invalid. In one embodiment, FPGA fabric 304 may transmit (N+1) bits, whereby the first N bits represent the data word, while the $(N+1)^{th}$ bit represents the data valid bit.

The data valid bit may be directly routed to data valid detect module 404 for a determination of validity. That is to say, if the data valid bit is transmitted as a logic high, for example, then the data received from FPGA fabric 304 is deemed to be valid. The validity determination of data valid detect block 404 is then effective to render multiplexer 406 operative to receive data from input data register 402.

If, on the other hand, the data valid bit is transmitted as a logic low, for example, then the data received from FPGA fabric 304 is deemed to be invalid. The validity determination of data valid block 404 is then effective to render multiplexer 406 operative to receive data signal DATA PATTERN from programmable data generator 410, instead of the data from input data register 402. In such an instance, signal DATA PATTERN is delivered to output data register 408 for subsequent transmission to an external device (not shown) in place of the invalid data received from FPGA fabric 304.

Figure 5:
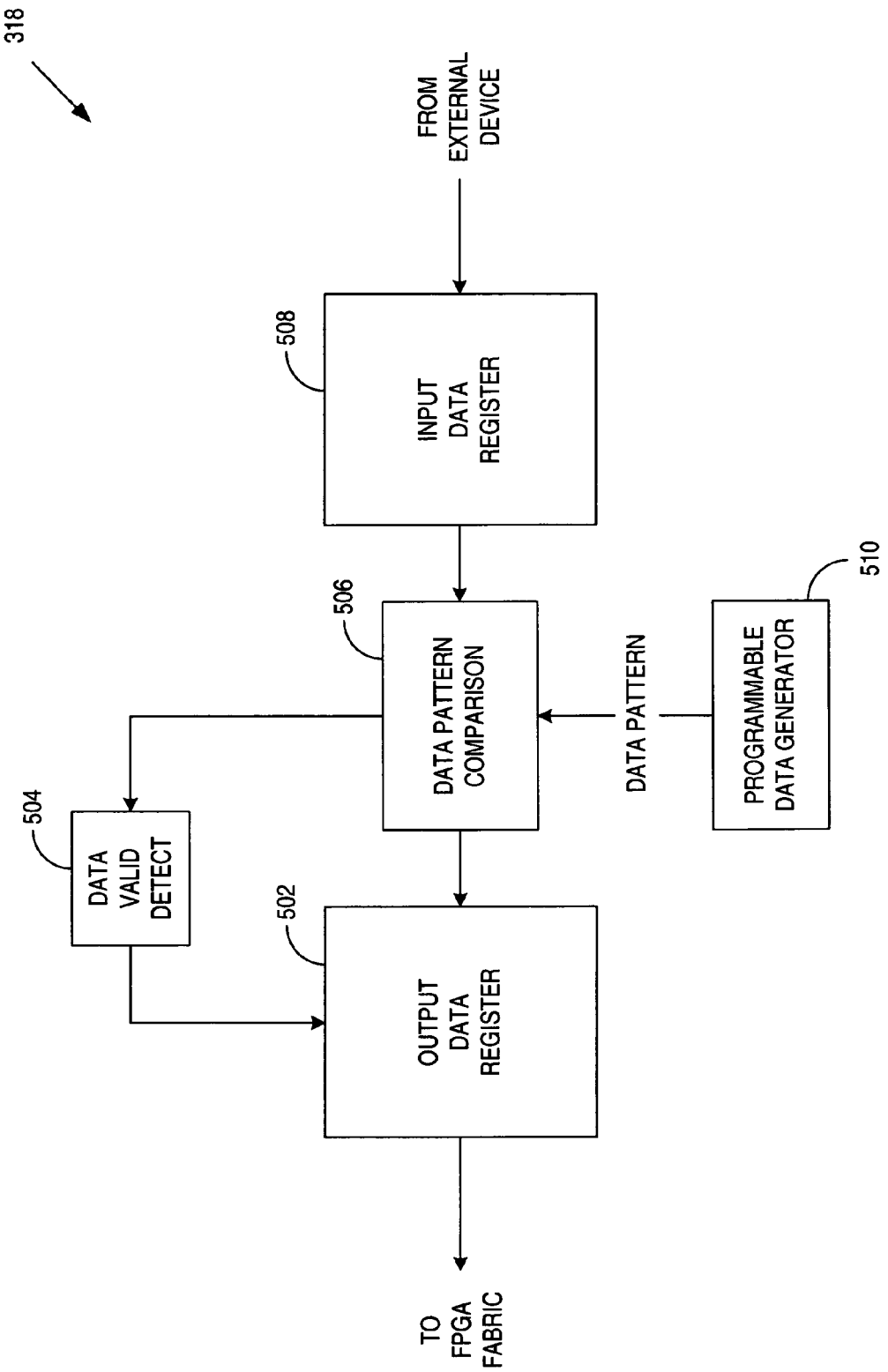
FIG. 5 illustrates an exemplary idle frame deletion block diagram in accordance with the present invention.

Turning to FIG. 5, one embodiment of idle delete block 318 of FIG. 3 is exemplified. Data received from an external device (not shown) is received by input data register 508. Signal DATA PATTERN is received from programmable data generator 510 and is compared by data pattern comparison block 506 to the data registered within input data register 508 in order to determine if a match exists. If a data match does exist, then the data received from the external device is deemed to be invalid.

Output data register 502 then receives the data from data pattern comparison block 506 along with the data valid signaling from data valid detect block 504. In one embodiment, output data register forwards the invalid data to FPGA fabric 304, along with the data valid signaling as received from data valid detect block 504. In an alternative embodiment, output data register 502 deletes the data received from data pattern comparison block 506 and forwards only the data valid signaling as received from data valid detect block 504.

It should be noted that through operation of one embodiment of the present invention, communication stacks 324 and 326 of FPGA fabric 304 are relieved of some of the overhead associated with any protocol specific signaling and data transfer that may be required during, for example, idle periods. In particular, knowledge of the specific data pattern that may be required by a particular communication protocol during idle periods is essentially removed from FPGA fabric 304 and is instead allocated to the configuration of transceiver 312.

In addition, one embodiment of the present invention provides the ability to program the idle character bits that are to be inserted into the data stream by idle insert block 316. Additionally, this embodiment of the present invention also provides the ability to program the idle character bits that are to be scanned by idle delete block 318. In one embodiment, the configuration of the idle character bits may be under user control, facilitated by uploading the idle character bits from FPGA fabric 304 to configuration module 310. In an alternative embodiment, idle character bit patterns may be generated by a programmable generator that is completely independent of FPGA fabric 304.

For example, programmable data generators 410 and 510 may provide protocol specific idle characters for use by idle insert block 316 and idle delete block 318, respectively. For example, data bits corresponding to square waves having a programmable duty cycle may be inserted into the idle character positions in order to accommodate, e.g., the 10 Gigabit Ethernet protocol. Still other communication protocols requiring data transition density and/or data packet delimiting may also be accommodated by the present invention.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An integrated circuit (IC), comprising:
a plurality of configurable logic resources coupled to a configuration memory and adapted to perform a logic function in response to data in the configuration memory; and
a hardwired logic circuit arranged to be coupled to the plurality of configurable logic resources in response to data in the configuration memory, the hardwired logic circuit adapted to exchange internal data with the configurable logic resources and including,
a first data-valid circuit coupled to receive the internal data and adapted to generate a first signal that indicates whether the internal data is valid;
a first register coupled to receive the internal data;
a programmable data generator adapted to generate programmable data with at least one value responsive to programming of the programmable data generator; and
a multiplexer coupled to the first data-valid circuit, the first register, and to the programmable data generator, the multiplexer arranged to select between data from the first register and data from the programmable data generator in response to a state of the first signal.

2. The IC of claim 1, wherein the first data-valid circuit is coupled to receive a data valid bit from the plurality of configurable logic resources and is adapted to provide the first signal in response to a logic level of the data valid bit.

3. The IC of claim 2, wherein the hardwired logic circuit further includes a second register coupled to an output of the multiplexer and adapted to latch the multiplexer output prior to transmission from the IC.

4. The IC of claim 3, wherein the hardwired logic circuit further includes a third register coupled to receive external data from outside the FPGA.

5. The IC of claim 4, wherein the hardwired logic circuit further includes a data comparison circuit coupled to the third register and the programmable data generator and adapted to compare the external data to programmable comparison data received from the programmable data generator.

6. The IC of claim 5, wherein the hardwired logic circuit further includes a second data-valid circuit coupled to the data comparison circuit and adapted to generate a data invalid signal when the external data matches the programmable comparison data.

7. The IC of claim 6, wherein the hardwired logic circuit further includes a fourth register coupled to the data comparison block and adapted to delete the external data in response to the data invalid signal.

8. In a programmable logic device (PLD), a hardwired logic circuit comprises:
a configuration module coupled to provide first and second programmable data words;
a first detector coupled to receive the first programmable data word and a first data word from a configurable logic portion of the PLD and adapted to replace the first data word with the first programmable data word in response to detecting that the first data word is invalid; and
a second detector coupled to receive a second data word from external to the PLD and adapted to compare the second data word to the second programmable data word to detect whether the second data word is invalid.

9. The hardwired logic circuit of claim 8, wherein the first and second programmable data words are different.

10. The hardwired logic circuit of claim 8, wherein the first and second programmable data words are equal and contain data bits having alternating logic values.

11. The hardwired logic circuit of claim 10, wherein the alternating logic values represent a square wave.

12. The hardwired logic circuit of claim 10, wherein the alternating logic values represent data packet delimiters.

13. The hardwired logic circuit of claim 8, wherein the first detector comprises a data valid detect block coupled to the configurable logic portion of the PLD and adapted to determine the validity of the first data word in response to signaling received from the configurable logic portion of the PLD.

14. The hardwired logic circuit of claim 8, wherein the second detector comprises a data register adapted to delete the second data word in response to the determination that the second data word is invalid.

15. The hardwired logic circuit of claim 8, wherein the second detector comprises a data register adapted to forward the second data word and an invalid data signal to the configurable logic portion of the PLD in response to detecting that the second data word is invalid.

16. A method of implementing a communication protocol, comprising:
transmitting first data words from within a configurable logic portion of a programmable logic device (PLD);
receiving the first data words at a hardwired logic portion of the PLD;

generating first programmable data words having values responsive to programming of the hardwired logic circuit;

replacing the first data words with the first programmable data words by the hardwired logic portion of the PLD in response to receiving an indication from the configurable logic portion of the PLD that the first data words are invalid;

receiving second data words from external to the PLD at the hardwired logic portion of the PLD;

generating second programmable data words having values responsive to programming of the hardwired logic circuit;

comparing the second data words to the second programmable data words in the hardwired logic portion of the PLD; and generating a comparison result signal in response to the comparison.

17. The method of claim 16, further comprising forwarding the second data words and the comparison result signal to the configurable logic portion of the PLD when the second data words are equal to the second programmable data words.

18. The method of claim 16, further comprising deleting the second data words and forwarding the comparison result signal to the configurable logic portion of the PLD when the second data words are equal to the second programmable data words.

19. The method of claim 16, wherein generating the second programmable data words includes generating second programmable data words that are equal to the first programmable data words.

* * * * *